(12) United States Patent
Watanabe et al.

(10) Patent No.: US 12,296,409 B2
(45) Date of Patent: May 13, 2025

(54) SOLDER MATERIAL

(71) Applicant: FUJI ELECTRIC CO., LTD., Kawasaki (JP)

(72) Inventors: Hirohiko Watanabe, Hachioji (JP); Shunsuke Saito, Hachioji (JP); Yoshihiro Kodaira, GuangDong (CN)

(73) Assignee: FUJI ELECTRIC CO., LTD., Kawasaki (JP)

( * ) Notice: Subject to any disclaimer, the term of this patent is extended or adjusted under 35 U.S.C. 154(b) by 19 days.

(21) Appl. No.: 18/506,384

(22) Filed: Nov. 10, 2023

(65) Prior Publication Data
US 2024/0075559 A1 Mar. 7, 2024

Related U.S. Application Data

(60) Division of application No. 16/290,401, filed on Mar. 1, 2019, now Pat. No. 11,850,685, which is a
(Continued)

(30) Foreign Application Priority Data
Mar. 17, 2017 (JP) .................................. 2017-053177

(51) Int. Cl.
*B23K 35/02* (2006.01)
*B23K 1/00* (2006.01)
(Continued)

(52) U.S. Cl.
CPC ........ *B23K 35/0222* (2013.01); *B23K 1/0016* (2013.01); *B23K 1/203* (2013.01);
(Continued)

(58) Field of Classification Search
None
See application file for complete search history.

(56) References Cited

U.S. PATENT DOCUMENTS 4,170,472 A 10/1979 Olsen et al.
4,670,217 A 6/1987 Henson et al.
(Continued)

FOREIGN PATENT DOCUMENTS

CN 101513141 A 8/2009
CN 105103279 A 11/2015
(Continued)

OTHER PUBLICATIONS

Chinese Office Action dated Jul. 27, 2020, in corresponding Chinese Patent Application No. 201880003396.1 with English Translation (19 pages).
(Continued)

*Primary Examiner* — Devang R Patel

(57) ABSTRACT

A solder material having a good thermal-cycle fatigue property and wettability. The solder material contains not less than 6.0% by mass and not more than 8.0% by mass Sb, not less than 3.0% by mass and not more than 5.0% by mass Ag, and the balance of Sn and incidental impurities. Also, a semiconductor device may include a joining layer between a semiconductor element and a substrate electrode or a lead frame, the joining layer being obtained by melting this solder material.

4 Claims, 2 Drawing Sheets

Related U.S. Application Data continuation of application No. PCT/JP2018/009760, filed on Mar. 13, 2018.

(51) Int. Cl.

| | | |
|---|---|---|
| *B23K 1/20* | (2006.01) | |
| *B23K 35/26* | (2006.01) | |
| *C22C 13/02* | (2006.01) | |
| *H01L 21/48* | (2006.01) | |
| *H01L 23/00* | (2006.01) | |
| *H05K 3/34* | (2006.01) | |
| *B23K 35/362* | (2006.01) | |
| *B23K 101/42* | (2006.01) | |

(52) U.S. Cl.
CPC ........ *B23K 35/0244* (2013.01); *B23K 35/025* (2013.01); *B23K 35/26* (2013.01); *B23K 35/262* (2013.01); *C22C 13/02* (2013.01); *H01L 21/4853* (2013.01); *H01L 24/00* (2013.01); *H01L 24/29* (2013.01); *H01L 24/48* (2013.01); *B23K 35/362* (2013.01); *B23K 2101/42* (2018.08); *H01L 24/32* (2013.01); *H01L 24/45* (2013.01); *H01L 24/73* (2013.01); *H01L 2224/05647* (2013.01); *H01L 2224/05655* (2013.01); *H01L 2224/29111* (2013.01); *H01L 2224/29211* (2013.01); *H01L 2224/32225* (2013.01); *H01L 2224/32245* (2013.01); *H01L 2224/45124* (2013.01); *H01L 2224/48091* (2013.01); *H01L 2224/48227* (2013.01); *H01L 2224/48247* (2013.01); *H01L 2224/48472* (2013.01); *H01L 2224/73265* (2013.01); *H01L 2224/83447* (2013.01); *H01L 2224/83455* (2013.01); *H01L 2924/014* (2013.01); *H01L 2924/10253* (2013.01); *H01L 2924/10272* (2013.01); *H01L 2924/1203* (2013.01); *H01L 2924/12041* (2013.01); *H01L 2924/13055* (2013.01); *H01L 2924/13091* (2013.01); *H01L 2924/14* (2013.01); *H01L 2924/15747* (2013.01); *H01L 2924/181* (2013.01); *H01L 2924/19107* (2013.01); *H01L 2924/3511* (2013.01); *H05K 3/3463* (2013.01)

(56) References Cited

U.S. PATENT DOCUMENTS

| | | | |
|---|---|---|---|
| 5,837,191 A | 11/1998 | Gickler | |
| 6,179,935 B1 | 1/2001 | Yamashita et al. | |
| 7,029,542 B2 | 4/2006 | Amagai et al. | |
| 7,282,175 B2 | 10/2007 | Amagai et al. | |
| 8,216,395 B2 | 7/2012 | Munekata et al. | |
| 8,771,592 B2 | 7/2014 | Hwang et al. | |
| 9,770,786 B2* | 9/2017 | Toyoda | C22C 13/00 |
| 10,727,194 B2* | 7/2020 | Watanabe | B23K 35/0244 |
| 2009/0261148 A1 | 10/2009 | Shoji et al. | |
| 2016/0035690 A1 | 2/2016 | Kido et al. | |
| 2016/0056570 A1* | 2/2016 | Yoshikawa | B23K 35/26 |
| | | | 174/257 |
| 2016/0325384 A1 | 11/2016 | Liu et al. | |
| 2016/0368104 A1* | 12/2016 | Irisawa | H01L 24/16 |
| 2018/0033761 A1 | 2/2018 | Watanbe et al. | |
| 2018/0277506 A1 | 9/2018 | Watanabe et al. | |

FOREIGN PATENT DOCUMENTS

| | | |
|---|---|---|
| CN | 106061669 A | 10/2016 |
| CN | 107427968 A | 12/2017 |
| DE | 11 2016 000 614 T5 | 10/2017 |
| DE | 11 2017 000 184 T5 | 8/2018 |
| EP | 3 112 080 A1 | 1/2017 |
| JP | 40-16897 B1 | 8/1965 |
| JP | 7-284983 A | 10/1995 |
| JP | 8-1372 A | 1/1996 |
| JP | 8-174276 A | 7/1996 |
| JP | 10-286689 A | 10/1998 |
| JP | 11-58066 A | 3/1999 |
| JP | 2003-94194 A | 4/2003 |
| JP | 2005-340268 A | 12/2005 |
| JP | 2008-41867 A | 2/2008 |
| JP | 2018-1179 A | 1/2018 |
| WO | 02/22302 A1 | 3/2002 |
| WO | 2011/151894 A1 | 12/2011 |
| WO | 2015/125855 A1 | 8/2015 |
| WO | 2017/047289 A1 | 3/2017 |
| WO | 2017217145 A1 | 12/2017 |

OTHER PUBLICATIONS

Extended European Search Report dated Apr. 23, 2019 in corresponding European Patent Application No. 18767948.5 (8 pages) (In English).
International Search Report issued Jun. 5, 2018 in corresponding International Application No. PCT/JP2018/009760.
Written Opinion of the International Searching Authority issued Jun. 5, 2018 in corresponding International Application No. PCT/JP2018/009760.
U.S. Restriction Requirement issued in U.S. Appl. No. 16/290,401 dated Feb. 5, 2021.
U.S. Non-Final Office Action issued in U.S. Appl. No. 16/290,401 dated Apr. 30, 2021.
U.S. Final Office Action issued in U.S. Appl. No. 16/290,401 dated Aug. 17, 2021.
U.S. Advisory Action issued in U.S. Appl. No. 16/290,401 dated Nov. 1, 2021.
U.S. Non-Final Office Action issued in U.S. Appl. No. 16/290,401 dated Jan. 28, 2022.
U.S. Final Office Action issued in U.S. Appl. No. 16/290,401 dated Jun. 14, 2022.
U.S. Advisory Action issued in U.S. Appl. No. 16/290,401 dated Sep. 23, 2022.
U.S. Non-Final Office Action issued in U.S. Appl. No. 16/290,401 dated Dec. 14, 2022.
U.S. Final Office Action issued in U.S. Appl. No. 16/290,401 dated Apr. 5, 2023.
U.S. Advisory Action issued in U.S. Appl. No. 16/290,401 dated Jul. 19, 2023.
U.S. Notice of Allowance issued in U.S. Appl. No. 16/290,401 dated Aug. 15, 2023.

* cited by examiner

SOLDER MATERIAL

CROSS-REFERENCE TO RELATED APPLICATIONS

This application is a divisional of U.S. patent application Ser. No. 16/290,401, filed Mar. 1, 2019, which is a continuation application, under 35 U.S.C. § 111(a), of International Application No. PCT/JP2018/009760, filed Mar. 13, 2018, which is based on and claims foreign priority to Japanese Patent Application No. 2017-053177, filed Mar. 17, 2017 the entire disclosures of all of which are herein incorporated by reference as a part of this application.

TECHNICAL FIELD

The present invention relates to a solder material. In particular, the present invention relates to a highly reliable solder material for use in joining components in a semiconductor device.

BACKGROUND ART

In recent years, Pb-free solder, containing no lead component, has increasingly been employed as an alternative to Sn—Pb based solder in consideration of environmental issues. The Pb-containing solder material, containing Sn—Pb as the main component, that has heretofore been used most commonly is a solid solution-type material and is a material having a eutectic point (eutectic temperature) with 63 wt % Sn and 37 wt % Pb. Since a solid solution-type material is such that materials are dissolved to be the main material, its solidified structures are said to be stable and not susceptible to process conditions (heating and cooling) and so on. Among lead-free solders of presently known various compositions, in particular Sn—Ag based Pb-free solders, which are relatively well balanced in terms of joinability (solder wettability), mechanical properties, thermal conduction resistance, and so on and have actually been used in products, and have been commonly used as solder materials for use in semiconductor devices such as IGBT modules (power modules).

Lead-free solders containing Sn—Ag as the main component have a precipitation dispersion-type structure, in which Ag hardly dissolves into Sn. A problem with these lead-free solders is that they are susceptible to process conditions and a structure in which Sn and a Sn—Ag eutectic structure are segregated and solidified is often formed. Moreover, in a high-temperature environment, primary crystals of Sn crystallizing as a result of the segregation solidification may be thermally deformed and cause breakage.

A solder alloy has been known which contains Sn as the main component and contains 2.5 to 3.5% by weight Sb, 1.0 to 3.5% by weight Ag, and not more than 1.0% by weight Ni to achieve improved thermal fatigue property and wettability (see Patent Document 1, for example).

A long composite solder material for connecting semiconductor chips has been known which contains a solder material, as a base material, containing 3 to 9% by weight Sb, 0.1 to 1% by weight Ni, 0.01 to 0.5% by weight Ag, and the balance of Sn except for incidental impurities, and 0.01 to 5% by weight of a particle-form material mixed to the base solder material, the particle-form material having a higher melting point than the base solder material (see Patent Document 2, for example).

A solder alloy has been known which contains Sn as the main component and contains not more than 3.0% by weight Sb, not more than 3.5% by weight Ag, not more than 1.0% by weight Cu, not more than 1.0% by weight Ni, and not more than 0.1% by weight Ge to achieve good thermal fatigue strength and joinability (see Patent Document 3, for example).

REFERENCE DOCUMENT LIST

Patent Documents

Patent Document 1: JP 10-286689 A
Patent Document 2: JP 8-174276 A
Patent Document 3: JP 11-58066 A

SUMMARY OF THE INVENTION

MOS and IGBT devices, which are called power semiconductor devices, generate heat themselves and become hot when operating. Elements that repetitively generate heat and cool down are joined to each other by solder. As a result of the repetitive heat generation of these elements, the soldered portions repetitively receive strain and thus deteriorate. There have been increasing demands for power semiconductor devices designed for high current in recent years. The high-current design increases the temperature of heat generation of the product and increases a temperature difference $\Delta T$ the product receives, specifically, the difference from the normal ambient temperature to the temperature of heat generation. This increases the temperature which the product is exposed to and also increases the length of time for which the product is exposed to the high temperature. A problem with this is that the repetitively applied temperature difference increases the strain (thermal stress) applied to the interface between the different materials, or the solder material and each joined member. Particularly when the temperature difference is 80 degrees or higher, the thermal stress is high and the strain causes detachment or the like at the interface between the different materials. To simulate this strain, thermal-cycle fatigue property testing is performed as accelerated testing. Given the current circumstance in which high-temperature properties of solder materials are important, it is necessary to improve this thermal-cycle fatigue property. In particular, it is important to improve the thermal-cycle fatigue property at a temperature difference of 80 degrees or more.

As a result of earnest studies, the present inventors found that a solder material having good ductility and wettability at high temperature and an improved thermal-cycle fatigue property could be obtained by setting the amount of Sb to be added in a Sn—Ag—Sb based solder within a predetermined narrow composition (%) range, and arrived at the present invention.

Specifically, according to an embodiment, the present invention is a solder material containing: not less than 5.0% by mass and not more than 8.0% by mass Sb; not less than 3.0% by mass and not more than 5.0% by mass Ag; and a balance of Sn and incidental impurities.

The above solder material containing Sb, Ag, and Sn preferably further contains not less than 0.05% by mass and not more than 0.3% by mass Ni.

The above solder material containing Sb, Ag, Ni, and Sn preferably further contains not less than 0.003% by mass and not more than 0.01% by mass Ge.

The above solder material containing Sb, Ag, Ni, and Sn or the above solder material containing Sb, Ag, Ni, Ge, and Sn preferably further contains not less than 0.003% by mass and not more than 0.01% by mass P.

The above solder material containing Sb, Ag, Ni, and Sn, the above solder material containing Sb, Ag, Ni, Ge, and Sn, or the above solder material containing Sb, Ag, Ni, Ge, P, and Sn is preferably for use in joining members made of, or plated with, Ni, Cu, or an alloy of Ni or Cu.

According to another embodiment, the present invention is a solder-joined part including: a to-be-joined member selected from members made of or plated with Ni, Cu, or an alloy of Ni or Cu; and a joining layer obtained by melting the above solder material containing Sb, Ag, Ni, and Sn, the above solder material containing Sb, Ag, Ni, Ge, and Sn, the above solder material containing Sb, Ag, Ni, P, and Sn, or the above solder material containing Sb, Ag, Ni, Ge, P, and Sn.

According to another embodiment, the present invention is a semiconductor device including a joining layer between a semiconductor element and a substrate electrode or lead frame or between the substrate electrode and a heat dissipation plate, the joining layer being obtained by melting any of the above solder materials.

In the above semiconductor device, the semiconductor element is preferably a SiC semiconductor element.

The solder material according to the present invention has good ductility particularly at high temperatures such as 100° C. to 200° C. and also high wettability, which can lower a void ratio. With this ductility at high temperature, the solder material can maintain a uniform crystal grain structure even after undergoing thermal cycles. Thus, an electronic device, in particular, a semiconductor device, using the solder material according to the present invention as a joining layer has a good thermal-cycle fatigue property and has improved reliability as a module. The solder material according to the present invention can therefore advantageously be used in a case in which the device is equipped with an element that generates high heat itself and a case in which the ambient temperature is high, and can also reduce the size and cost of the device. Moreover, since the amount of voids in the joining layer is small, the product life is improved. The solder material according to the present invention can be advantageously used in electronic devices designed for high current, which are increasingly in demand, and can be advantageously used particularly in a wide range of semiconductor device applications such as joining for die bonding, joining of terminals, and joining of other members in a semiconductor device.

DETAILED DESCRIPTION

Figure 1:
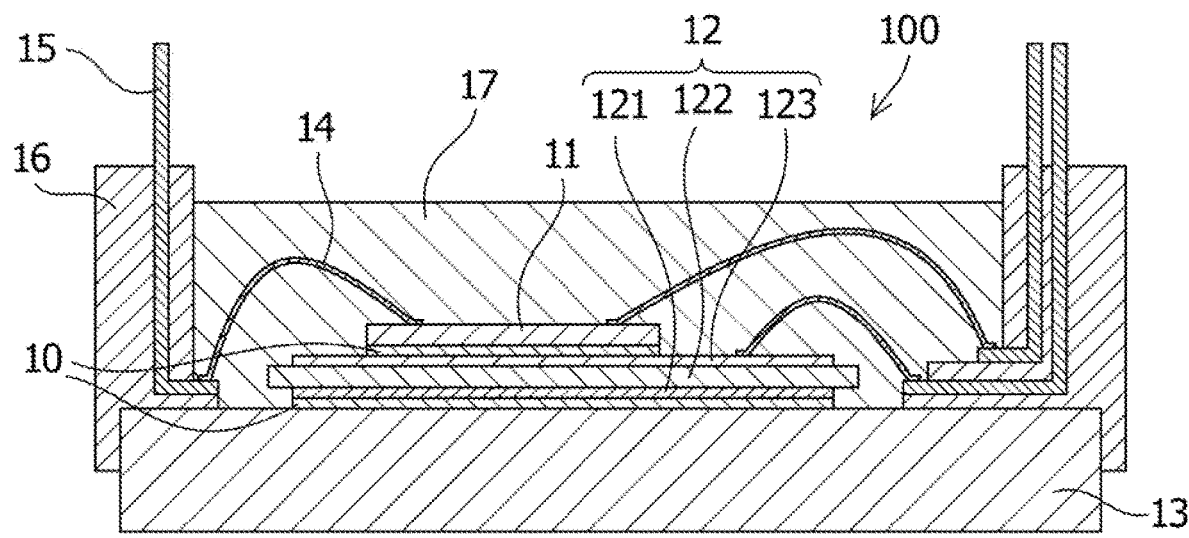
FIG. 1 is a conceptual diagram illustrating an example of a semiconductor device using a solder material according to the present invention.

Embodiments of the present invention will be described below with reference to drawings. However, the present invention is not limited to the embodiments to be described below.

First Embodiment: Sn—Sb—Ag Ternary System

According to a first embodiment, the present invention is a solder material and is an alloy containing not less than 5.0% by mass and not more than 8.0% by mass Sb, not less than 3.0% by mass and not more than 5.0% by mass Ag, and the balance of Sn and incidental impurities. The incidental impurities mainly include, but are not limited to, Cu, Ni, Zn, Fe, Al, As, Cd, Au, In, P, Pb, etc. The solder material according to the present invention is a lead-free solder alloy, containing no Pb. The solder material mainly contains Sn, Ag and Sb within the above composition ranges to achieve high ductility at high temperature. Also, the solder material according to this embodiment can achieve relatively high wettability, i.e., the ability to create an uninterrupted layer of soldering material on a surface when melted solder contacts the surface.

When the amount of Ag added is less than 3.0% by mass a network structure of $Ag_3Sn$ and $\beta Sn$ is formed only partially, thereby increasing $\beta Sn$ regions, which have the highest ductility. That is, there are local portions with high ductility and portions with high hardness in which precipitation-strengthening structures are formed with eutectic structures of $Ag_3Sn$ and $\beta Sn$. In such a case, the solder material is prone to fracture upon receiving repetitive stress as in thermal cycle testing.

On the other hand, if the amount of Ag added is more than 5.0% by mass, the composition is hypereutectic. That is, the amount of Ag is so large that there will be denser eutectic structures of $Ag_3Sn$ and $\beta Sn$ and an excess of precipitation-strengthening structures. Also, the distance between $Ag_3Sn$ and $\beta Sn$ resulting from the network structure between $Ag_3Sn$ and $\beta Sn$ is short, so that $Ag_3Sn$ appears as a large compound. As a result, large masses of a hard compound are distributed in the composition. When this compound having such masses of $Ag_3Sn$ is subjected to a thermal process, external force, or the like, Sn and Ag are interdiffused and form a large mass of the $Ag_3Sn$ compound. This makes it impossible to obtain stable and uniform solidified structures, to satisfy both strength and ductility and to improve the joining strength.

Also, if Sb is more than 8% by mass, the $Sb_3Sn_2$ compound crystallizes into Sn—Sb peritectic structures having an Sb core in a case in which joining is performed at a cooling rate of normal soldering, e.g., at 20° C./sec or less. This crystallization of the $Sb_3Sn_2$ compound improves the strength but lowers the ductility. Also, upon thermal deformation and strain due to heat generation or the like, this compound moves to grain boundaries and the Sb—Sn compound coarsens due to interdiffusion with Sn. This coarse compound lowers the grain boundary strength of crystals and easily promotes grain boundary sliding, that is displacement of grains against each other, and the like. This leads to formation of cavities at grain boundaries and therefore a decrease in ductility and strength.

In the present invention, ductility at high temperature refers to ductility at 100° C. or higher, e.g. about 100° C. to 200° C. Also, this ductility at high temperature can be evaluated by means of elongation after fracture (%) measured under a predetermined temperature condition. The elongation after fracture (percentage elongation after fracture) is a physical property value defined in JIS Z2241 Metallic Material Tensile Testing Method and represents the percentage of permanent elongation after fracture ($Lu-L_0$) with respect to an original gauge length $L_0$. Here, L denotes the length of the test piece's parallel portion, which is a portion in which elongation is to be measured (gauge length), Lu denotes the distance between gauge marks drawn on the test piece and measured at room temperature after fracture (final gauge length), and $L_0$ denotes the distance between the gauge marks drawn on the test piece and measured at room temperature before the test (original gauge length). The method of measuring the elongation after fracture will be described in detail in examples. The elongation after fracture of the solder material according to the first embodiment at 100° C. is about 52% to 54.8%. Such a value is 102% or more of the elongation after fracture of a Sn-8.5Sb-2.5Ag solder material, which is outside the ranges defined in the present invention, and about 102 to 108%. Also, the elongation after fracture at 175° C. is about 60% to 62%. Such a value is 113% or more of the elongation after fracture of the Sn-8.5Sb-2.5Ag solder material, which is outside the ranges defined in the present invention, and is about 113 to 117%. With this high ductility at high temperature, the solder material does not experience breakage such as cracking and fracture when thermal stress is applied, and it can therefore achieve high joining strength.

More preferably, the solder material may contain not less than 6.0% by mass and not more than 8.0% by mass Sb, not less than 3.6% by mass and not more than 4.5% by mass Ag, and the balance of Sn and incidental impurities. With Sb within the above range, the components are close to the eutectic components, so that Sb dissolves into Sn and suppresses growth of primary crystals of Sn. As a result, there will be fewer defects (voids). Also, since Sb dissolves, an effect such as uniform deformation of Sn can be expected. Also, with Ag within the above range, Ag, which undergoes only minor changes at high temperature, is dispersed as a fine $Ag_3Sn$ compound uniformly in the solder, thereby functioning to allow dispersion strengthening of the solder structure. Also, as mentioned above, by being dispersed as a fine compound, Ag can be expected to have the effect of suppressing thermal deformation when the solder material is exposed to high temperature. Properties of the solder material with this composition vary greatly by the composition ratio of Sb and Ag, and setting a composition ratio as above to control the behavior of Ag can further enhance the joining strength.

From the above, with Sb and Ag within the predetermined composition ranges according to this embodiment, it is possible to maintain high strength and ductility. In a situation in which the solder material is exposed to thermal cycles with a temperature difference of 80 degrees or higher, the thermal stress is high. Even with such thermal stress, the high strength of the solder joining layer prevents breakage such as detachment and cracking and can therefore achieve high reliability.

Second Embodiment: Sn—Sb—Ag—Ni Quaternary System

According to a second embodiment, the present invention is a solder material and is a lead-free solder alloy containing no Pb but containing not less than 5.0% by mass and not more than 8.0% by mass Sb, not less than 3.0% by mass and not more than 5.0% by mass Ag, and further not less than 0.05% by mass and not more than 0.3% by mass Ni, and the balance of Sn and incidental impurities. An advantage of further adding Ni within the above addition range to the composition in the first embodiment is that it can further improve the ductility of the solder material at high temperatures. In this range of amounts of Ni to be added, not less than 0.1% by mass and not more than 0.25% by mass is particularly preferable because this range provides the highest wettability.

The elongation after fracture of the solder material according to the second embodiment at 100° C. is about 55%. This value is 108% or more of the elongation after fracture of the Sn-8.5Sb-2.5Ag solder material, which is outside the ranges defined in the present invention, and is about 108 to 109%. Also, the elongation after fracture at 175° C. is about 65% to 65.5%. Such a value is 123% or more of the elongation after fracture of the Sn-8.5Sb-2.5Ag solder material, which is outside the ranges defined in the present invention, and is about 123 to 124%. With this high ductility at high temperature, the solder material does not experience breakage such as cracking and fracturing when thermal stress is applied, and it can therefore achieve high joining strength, as mentioned earlier.

More preferably, the solder material may contain not less than 6.0% by mass and not more than 8.0% by mass Sb, not less than 3.6% by mass and not more than 4.5% by mass Ag, not less than 0.1% by mass and not more than 0.25% by mass Ni, and the balance of Sn and incidental impurities. These composition ranges can be expected to have the effect of suppressing formation of solidification defects due to change in volume of each material in solidification in addition to the abovementioned effect. In a joined body that needs to be heated to high temperature, defects (air) conduct heat very poorly. In other words, they act as heat insulators. Mass production of joined bodies with a solder material is required to reduce defects, and the solder material with the preferable composition according to this embodiment can reduce those defects. Also, since the solder material has a uniform solidified structure, an effect such as suppression of growth of cracks can be expected.

Solder materials can be used to join any metallic members in an electronic device. In particular, when members made of, or plated with, copper, a copper alloy, nickel, or a nickel alloy are the to-be-joined members, the joinability is particularly good. A Cu—Sn alloy such as $Cu_3Sn$ and a Cu—Sb alloy are easily formed from Sn and Sb, which are components of the solder, and a component of the to-be-joined members such as Cu. However, these alloys are not so preferable in view of joining strength. The solder material according to the second embodiment, containing a predetermined amount of Ni, has the effect of suppressing the production of these alloys, and therefore improves joinability.

Third Embodiment: Sn—Sb—Ag—Ni—Ge Five-Component

According to a third embodiment, the present invention is a solder material and is a lead-free solder alloy containing no Pb but containing not less than 5.0% by mass and not more than 8.0% by mass Sb, not less than 3.0% by mass and not more than 5.0% by mass Ag, not less than 0.05% by mass and not more than 0.3% by mass Ni, and further not less than 0.003% by mass and not more than 0.01% by mass Ge, and the balance of Sn and incidental impurities. An advantage of further adding Ge within the above addition range to the composition in the second embodiment is that it can further improve the ductility of the alloy at high temperature. Another advantage is that the addition suppresses oxidation of Sb and greatly contributes to improvement of the wettability of the solder.

If more than 0.01% by mass Ge, e.g., about 0.02% by mass Ge is used, air voids, which are joining defects, are likely to be formed.

The amount of Ge to be added is more preferably not less than 0.003% by mass and not more than 0.008% by mass. Adding Ge within this range can suppress excessive production of GeO but allow production of an appropriate amount of GeO and suppress production of Sn oxide, which is difficult to reduce and remove. Also, the addition has the effect of suppressing formation of voids.

The amount of Ge added is even more preferably an amount not less than 0.003% by mass and less than 0.005% by mass. Meanwhile, GeO is formed also on the surface of the solder material. However, as long as the amount of Ge added is within the above range, the film thickness of GeO is very small. Thus, when the solder material is heated and joined to a to-be-joined member, the wettability is not poor and the joining is easy.

Note that Sn oxide is formed as a film on the surface of a solder material and therefore suppresses the reaction with a to-be-joined member. Thus, the Sn oxides can cause decrease in joinability and also cause local formation of voids. In particular, in power semiconductor devices, the ratio of voids in a solder joining preferably needs to be less than 10%. The effect of suppressing production of the Sn oxide by the solder material according to this embodiment, containing a predetermined amount of Ge, is therefore important. Also, if the Sn oxides are formed in a distributed manner in the solder joining layer in the joining process, the joinability is lowered at those spots. The suppression of production of the Sn oxides is therefore important. Meanwhile, Ge has a property that it is resistant to forming alloys with other metals. Ge that has dissolved as a simple substance without forming unnecessary compounds suppresses growth of cracks and therefore increases the strength.

The elongation after fracture of the solder material according to the third embodiment at 100° C. is about 55%. This value is 108% or more of the elongation after fracture of the Sn-8.5Sb-2.5Ag solder material, which is outside the ranges defined in the present invention, and about 108 to 109%. Also, the elongation after fracture at 175° C. is about 66% to 67%. Such a value is 125% or more of the elongation after fracture of the Sn-8.5Sb-2.5Ag solder material, which is outside the ranges defined in the present invention, and about 125 to 127%. In the case of using the solder material with this high ductility at high temperature, the solder material does not experience breakage such as cracking and fracture when thermal stress is applied, and can therefore achieve high joining strength.

More preferably, the solder material may contain not less than 6.0% by mass and not more than 8.0% by mass Sb, not less than 3.6% by mass and not more than 4.5% by mass Ag, not less than 0.1% by mass and not more than 0.25% by mass Ni, Ge within any of the above-mentioned ranges, and the balance of Sn and incidental impurities. These composition ranges can be expected to have the effect of suppressing formation of solidification defects due to change in volume of each material in solidification in addition to the abovementioned effect. In a joined body that needs to be heated to high temperature, defects (air) conduct heat very poorly. In other words, they act as heat insulators. Mass production of joined bodies with a solder material is required to reduce defects, and the solder material with the preferable composition according to this embodiment can reduce those defects. Also, since the solder material has a uniform solidified structure, an effect such as suppression of growth of cracks can be expected.

The solder material according to the third embodiment can also be used to join any metallic members in an electronic device. In particular, the solder material has a composition containing a predetermined amount of Ni. Thus, for a similar reason to that mentioned in the second embodiment, when members made of, or plated with, copper, a copper alloy, nickel, or a nickel alloy are the to-be-joined members, the joinability is particularly good. In addition to this, this embodiment has the following advantages by containing Ge. When the to-be-joined members are made of a substance such as copper or nickel and a solder material containing Sn and Sb is used, a Cu—Sn alloy such as $Cu_3Sn$ and a Cu—Sb alloy or $Ni_3Sn_4$ and the like are easily formed from Sn and Sb, which are components of the solder, and a component of the to-be-joined members such as Cu. These alloys are not so preferable in view of joining strength. If, however, Ge is contained in addition to substances such as Sn and Sb, it can suppress the production of these alloys and therefore improve the joining strength. In the case in which the to-be-joined members are formed from NiP (nickel-phosphorus) by plating or the like, Sn in the solder and Ni in the NiP layer are interdiffused and form an alloy, so that a P-rich layer is formed at the interface between the NiP layer and the solder. This P-rich layer, resulting from separation of Ni, is very brittle and can cause decrease in joining strength. However, with the solder material according to the third embodiment, in which Ge is added, a GeP compound is produced. This can suppress decrease in joining strength. The concentration of P in a NiP to-be-joined member is usually 3 to 12% by mass. However, in a case in which a NiP to-be-joined member has a P concentration of 3 to 5% by mass and thus forms a small amount of P-rich layer, the solder material according to this embodiment is particularly effective.

Fourth Embodiment: Sn—Sb—Ag—Ni—P Five-Component

According to a fourth embodiment, the present invention is a solder material and is a lead-free solder alloy containing no Pb but containing not less than 5.0% by mass and not more than 8.0% by mass Sb, not less than 3.0% by mass and not more than 5.0% by mass Ag, not less than 0.05% by mass and not more than 0.3% by mass Ni, and further not less than 0.003% by mass and not more than 0.01% by mass P, and the balance of Sn and incidental impurities. An advantage of further adding P within the above range to the composition in the second embodiment is that it can further improve the ductility of the alloy at high temperature. Another advantage is that the addition suppresses oxidation of Sb and greatly contributes to improvement of the wettability of the solder.

If more than 0.01% by mass P, e.g. about 0.02% by mass P is contained, air voids, which are joining defects, are likely to be formed.

The amount of P to be added is more preferably not less than 0.003% by mass and not more than 0.008% by mass. Adding P within this range can suppress excessive production of phosphorus oxide but allow production of an appropriate amount of the phosphorus oxide and suppress production of Sn oxide, which is difficult to reduce and remove. Also, the addition has the effect of suppressing formation of voids.

The amount of P to be added is even more preferably an amount not less than 0.003% by mass and less than 0.005% by mass. The effect of suppressing production of the Sn oxide by the predetermined amount of P in this embodiment is similar to that by Ge. While P is usually a material that produces an inorganic phosphoric acid and causes metallic corrosion, the solder material according to the fourth embodiment, in which the amount of P added is not less than 0.003% by mass and not more than 0.01% by mass, does not show joining failures such as corrosion and cracking in an endurance test such as a thermal cycle fatigue test and can achieve good joining strength.

Also, while Ge is resistant to forming compounds with other metals, P forms compounds with substances in the solder material such as Sn. In particular, a SnP compound has high hardness. Adding not less than 0.003% by mass and not more than 0.01% by mass P to a solder material containing Sn has the effect of improving the tensile strength. Also, as will be described later, a compound is produced between the solder material and an element in a to-be-joined member. Accordingly, the reaction at the time of joining is quick, and the joining can be done in a short time. However, if more than 0.01% by mass P is contained, the brittleness will be high, which is not preferable. Specifically, such an amount of P makes the solder material locally brittle and causes breakage such as cracking and therefore lowers the joining strength.

The elongation after fracture of the solder material according to the fourth embodiment at 100° C. is about 55%. This value is 108% or more of the elongation after fracture of the Sn-8.5Sb-2.5Ag solder material, which is outside the ranges defined in the present invention, and about 108 to 109%. Also, the elongation after fracture at 175° C. is about 66% to 67%. Such a value is 125% or more of the elongation after fracture of the Sn-8.5Sb-2.5Ag solder material, which is outside the ranges defined in the present invention, and about 125 to 127%. With this high ductility at high temperature, the solder material does not experience breakage such as cracking and fracture when thermal stress is applied, and can therefore achieve high joining strength.

More preferably, the solder material may contain not less than 6.0% by mass and not more than 8.0% by mass Sb, not less than 3.6% by mass and not more than 4.5% by mass Ag, not less than 0.1% by mass and not more than 0.25% by mass Ni, P within any of the abovementioned ranges, and the balance of Sn and incidental impurities. These composition ranges can be expected to have the effect of suppressing formation of solidification defects due to change in volume of each material in solidification in addition to the abovementioned effect. In a joined body that needs to be heated to high temperature, defects (air) conduct heat very poorly. In other words, they act as heat insulators. Mass production of joined bodies with a solder material is required to reduce defects, and the solder material with the preferable composition according to this embodiment can reduce those defects. Also, since the solder material has a uniform solidified structure, an effect such as suppression of growth of cracks can be expected.

Meanwhile, as a further modification of this embodiment, the solder material may be a Sn—Sb—Ag—Ni—Ge—P six-component solder material, containing both Ge and P. In this case, the amounts of Ge and P to be added can be independently selected from the addition amounts exemplarily presented as preferable ranges in the third and fourth embodiments, respectively. With the Sn—Sb—Ag—Ni—Ge—P six-component solder material, the predetermined amount of Ge forms a compound with P, thereby making it possible to suppress formation of a SnP compound and further improve the joining strength, in addition to the improvement in strength by the addition of the predetermined amount of P. Note that if P and Ge are added outside the above predetermined ranges, the solder material will be brittle and the strength will be low, which is not preferable.

The solder material according to the fourth embodiment or its modification can also be used to join any metallic members in an electronic device. In particular, the solder material has a composition containing a predetermined amount of Ni. Thus, for a similar reason to those mentioned in the second and third embodiments, when members made of, or plated with, copper, a copper alloy, nickel, or a nickel alloy are the to-be-joined members, the joinability is particularly good. In particular, the solder material according to the fourth embodiment or its modification has the following further advantages for each to-be-joined member by containing P in particular. When the to-be-joined member is made of Cu or Ni, P contained in the solder material produces a compound such as $CuP_2$ with Cu at a high reaction rate. Thus, the wettability with Cu is good. Moreover, the $CuP_2$ compound produced from the predetermined amount of P is uniformly diffused in the solder material, and the $CuP_2$ compound is hard, so that the strength is improved. However, if the amount of P exceeds the abovementioned predetermined amount, the $CuP_2$ compound will be produced in a large amount and may accumulate locally, in which case those spots are brittle and lower the strength, which is not preferable. On this point, the solder material according to the fourth embodiment or its modification can retard the growth of brittle compounds and contribute to extension of the life of the joined body. This applies similarly to the case in which the to-be-joined member is a Ni to-be-joined member. In sum, the solder material according to the fourth embodiment or its modification can improve the strength. Meanwhile, P contained in the solder material can produce a plurality of compounds with Ni in a Ni to-be-joined member, and the rate of these reactions is higher than that of the reaction between P and Cu. Thus, the wettability is very good. In the case in which the to-be-joined member is formed from NiP by plating or the like, it is possible to suppress separation of Ni from the NiP layer and suppress decrease in joining strength, as described in the third embodiment. This effect is high, particularly when the solder material according to the fourth embodiment or its modification is used with a NiP to-be-joined member that has a P concentration of 3 to 5% by mass and thus forms a small amount of P-rich layer.

The solder materials according to the above first to fourth embodiments can each be prepared by dissolving Sn, Sb, and Ag and one or more optional raw materials selected from Ni and Ge or the master alloy containing each of the raw materials in an electric furnace by a common method. The raw materials with a purity of 99.99% or higher by mass are preferably used.

Also, the solder materials according to the first to fourth embodiments can each be processed into a plate-shaped preform material or processed into solder cream by being made into a powder form and mixed with a flux. In the case in which the solder material is processed into solder cream by being made into a powder form and mixed with a flux, the distribution of the particle size of the solder powder is preferably in the range of 10 to 100 μm and more preferably in the range of 20 to 50 μm. The average particle size of such solder powder is 25 to 50 μm when measured with a commonly used laser diffraction/scattering particle size distribution measuring apparatus, for example. As the flux, any flux is usable, but it is preferable to use a rosin-based flux in particular.

Next, a method of using the solder materials according to the above first to fourth embodiments will be described. The solder materials according to the above first to third embodiments can be used to join any metallic members in an electronic device. In particular, they can be used to join members made of or plated with a metal such as Cu, Ni, Ag, Au, or Al or an alloy of Cu, Ni, Ag, Au, or Al, but the application is not limited to specific to-be-joined members. Nonetheless, as mentioned above, in the case in which the solder material contains Ni as in the second to fourth embodiments, better joinability can be achieved if at least one of the to-be-joined members, and preferably both of them, are members made of, or plated with, Cu or Ni or an alloy of Cu or Ni.

The thickness, shape, etc. of the solder materials to be used for joining can be set as appropriate by those skilled in the art in accordance with the purpose and usage and are not particularly limited. As compared to solder materials of conventional techniques, the solder materials in the above embodiments have good wettability and are therefore resistant to formation of voids and can also be shaped to be thin. A thin solder material has lower thermal resistance than otherwise, and is therefore preferable for some semiconductor devices. Here, if a semiconductor device's chip is warped, the solder material needs to be thicker by the amount of the warpage, in which case voids are likely to be formed. With good wettability, however, formation of voids due to air gaps can be prevented. Moreover, when the solder material is thick, it has a stress relaxation effect and the service life may be longer. Thus, owing to its superior properties, the solder material of the present invention can be thin or thick and therefore has the advantage that it has a high degree of freedom of design. In one example, the solder material of the present invention can be a solder joining layer having a thickness of approximately 200 to 300 pin in a joined state. However, the thickness is not limited to this range.

In a preferable method of joining metallic members with the solder material, the solder material and each metallic member are brought into contact with each other, and the solder material is melted with the heating peak temperature set to the solder material's liquidus line temperature (melting point)+about 30° C. to form a solder joining layer. The heating in this instance is preferably held for at least 60 seconds. The joining can be performed using an active atmosphere of hydrogen or an organic acid such as formic acid, depending on the composition of the solder material.

Fifth Embodiment: Joined Part, Electronic Device

According to a fifth embodiment, the present invention relates to an electronic device. Specifically, it relates to an electronic device including a solder joining layer obtained by melting any of the solder materials according to the first to fourth embodiments. A joined part including the solder joining layer and a metallic member being a to-be-joined member is defined as an embodiment of the present invention. It is sufficient for the to-be-joined member to be a metallic member, and the to-be-joined member is not particularly limited. In particular, however, in the case of using any of the Ni-containing solder materials according to the second to fourth embodiments as the solder joining layer, the to-be-joined member is preferably selected from members made of, or plated with, Ni, Cu, or an alloy of Ni or Cu. The plurality of to-be-joined members to be in contact with the solder joining layer may be made of the same material or different materials. However, at least one of the to-be-joined members is preferably a member made of, or plated with, Ni, Cu, or an alloy of Ni or Cu in view of joinability. Also, to-be-joined members in electronic devices preferably have low electrical resistance and high thermal conductivity, and they therefore contain Cu or Ag as the main component. In view of corrosion resistance, the surfaces to be joined are processed with Ni, a Ni coating, a Ni alloy, or the like. Ni has lower joinability to solder than Cu does. To improve the corrosion resistance and wettability, it is possible to additionally perform a surface treatment with a precious metal such as Ag, Au, Pt, Pd, or Ag—Pd. In power converters etc. using elements of SiC or the like that are low in loss by electrical resistance, Ag is often used as an electrode material to minimize the loss. The solder joining is a component of an electronic device, and the electronic device includes, but not limited to, electric and electronic devices such as inverters, mega solar power systems, fuel cells, elevators, cooling devices, and in-vehicle semiconductor devices.

Generally, electronic devices are semiconductor devices. The solder materials according to the first to fourth embodiments are useful particularly for power semiconductor devices. For semiconductor devices designed to be used at a high temperature of 150° C. or higher due to the increase in capacity in recent years, it is important to efficiently dissipate heat generated from elements. It is then important to reduce voids in joining layers. While a void ratio of 20% or more is tolerable for solder joining layers used in devices such as inverters, the tolerable void ratio for power semiconductor devices is at most 20% and preferably about 10% or less. By using any of the solder materials according to the first to fourth embodiments, it is possible to suppress formation of voids in a joining layer. Thus, a solder joining layer using any of these solder materials is particularly useful for power semiconductor devices. A joining in a semiconductor device may be, but not limited to, a die-bonding join, a joining of an insulating substrate and a heat dissipation plate, a joining of a terminal and a terminal, a joining of a terminal and a different member, and a joining of any other members. The present invention will be more specifically described below with reference to drawings, by taking a semiconductor device as an example of the electronic device with joins according to this embodiment.

FIG. 1 is a conceptual cross-sectional view of a power module as an example of the semiconductor device. A power module 100 is basically a laminate structure in which a semiconductor element 11 and a laminate substrate 12 are joined onto a heat dissipation plate 13 with a solder joining layer 10. A case 16 incorporating external terminals 15 is bonded to the heat dissipation plate 13, and electrodes of the semiconductor element 11 and a metallic conductive plate 123 of the laminate substrate 12 are connected to the external terminals 15 by wires 14 such as aluminum wires. The inside of the module is filled with a resin sealant 17. The semiconductor element 11 may be, but not limited to, a Si semiconductor element or a SiC semiconductor element. In the case of such an element mounted to, for example, an IGBT module, its back-surface electrodes to be joined to the laminate substrate 12 are usually made of Au or Ag. In the laminate substrate 12, a metallic conductive plate 121 and the metallic conductive plate 123 of copper or aluminum are provided on the front and back of a ceramic insulating substrate 122 contains $Al_2O_3$ or SiN, for example. For the heat dissipation plate 13, a metal with good thermal conductivity, such as copper or aluminum, is used. Also, the metallic conductive plates 121 and 123 and the heat dissipation plate 13 may be coated with Ni and a Ni alloy to prevent corrosion.

In addition, although not illustrated in FIG. 1, the solder joining layer 10 may be formed to cover not only the bottom surface but the side surface of the metallic conductive plate 121 of the laminate substrate 12. This configuration in which the solder material covers the side surface of the metallic conductive plate is specifically illustrated in FIG. 3. Covering the metallic conductive plate up to its side with the solder can improve the joining strength.

The semiconductor device illustrated in this embodiment is merely an example, and the semiconductor device according to the present invention is not limited to semiconductor devices having the illustrated device configuration. For example, the semiconductor device according to the present invention may be a semiconductor device with a lead frame disclosed in Japanese Patent Application Publication No. 2005-116702 by the present applicants. In the configuration of the semiconductor device with a lead frame, the solder material of the present invention can be used to join the lead frame and a semiconductor element. Alternatively, the semiconductor device according to the present invention may be a semiconductor device with a pin structure disclosed in Japanese Patent Application Publication No. 2012-191010 by the present applicants. In this semiconductor device, the solder material of the present invention can be used to join a copper block and a semiconductor element and to join a copper pin and the semiconductor element. Moreover, in addition to such usage for die bonding, the solder material of the present invention can also be used for any solder joining in a semiconductor device, e.g. to join an insulating substrate and a heat dissipation plate, a terminal and a terminal, or a semiconductor element and a terminal. A semiconductor device using the solder material of the present invention has an improved thermal-cycle fatigue property and therefore has a markedly longer thermal cycle life. This improved thermal-cycle fatigue property is achieved by the fact that the solder material having the predetermined composition ranges according to any of the above first to fourth embodiments has superior characteristics in terms of ductility at high temperature that reduces voids in the joining and allows the joining to maintain a uniform crystal grain structure even after being exposed to thermal cycles. The solder material is effective particularly for the thermal-cycle fatigue property at a temperature difference of 80 degrees or higher.

EXAMPLES

More specific description will be given below with reference to examples of the present invention. It is to be noted that the following examples and consideration of these do not limit the present invention.

Solder materials of examples 1 to 18 and comparative examples 1 to 5 were prepared. Then, high-temperature properties and initial property of each of the solder materials were evaluated, and a reliability test was performed on each of modules obtained by joining components with the solder materials.

[Evaluation of High-Temperature Properties of Solder Materials]

The high-temperature properties of each solder material were evaluated by measuring the tensile strength of the solder material at 100° C. and the elongation after fracture at normal temperature (approximately 25° C.) and high temperatures of 100° C., 135° C., and 175° C. The elongation after fracture was tested based on JIS Z2241 Metallic Material Tensile Testing Method by using a dumbbell test piece shape similar to the type-4 test piece. Using a dumbbell-shaped isometric test piece with a parallel portion measuring 6 mm in diameter and 40 mm in length, tensile fracture testing was performed at a strain rate of 0.02%/sec.

The tester used was a high-accuracy micro-force tester (manufactured by Instron Japan Company, Ltd., Model 5848). As for the specific conditions for the measurement, separation in the tensile testing direction was controlled (from 10.000 to −0.200) and the rate of the tensile testing was set at 0.005 (mm/s). The stress sampling period was 0.02 sec, and the testing was performed on the assumption that fracture at a cross-sectional area of 0.785 mm$^2$ within a gauge length of 2400 μm was valid testing.

The largest value of the stress was determined as the tensile strength (Mpa) and the strain (%) at the point when the stress became 0 was determined as the elongation after fracture (%). Table 1 lists the measured values of the elongation after fracture (%) at 100° C. and 175° C. for examples 1 to 18 and comparative examples 1 to 5.

[Evaluation of Initial Property of Solder Materials]

An initial property involved in joining metallic members with each of the solder materials was evaluated by measuring the wettability. The wettability at the joining was evaluated by measuring the ratio of voids formed by joining a DCB (Direct Copper Bonding) substrate, obtained by forming Cu electrodes in ceramic, and a Cu heat dissipation plate with the solder materials of the examples and comparative examples. As for the conditions for the joining, a DCB substrate and a copper heat dissipation plate joined at 300° C. for three minutes in a hydrogen atmosphere with an oxygen concentration of not more than 50 ppm, was used as a test piece. In this joining, the thickness of the solder material was basically 0.15 mm. The solder joining thus obtained was observed by ultrasonic testing (SAT: Scanning Acoustic Tomography). From the SAT transmission image, the void ratio was calculated by identifying spots with air as joining defect voids with the area of the electrode defined as 100%. Table 1 lists the actual measured values of the void ratio (%). In terms of heat dissipation performance, the property can be determined as inferior when the void ratio is 20% or more, and determined as superior when the void ratio is less than 20%. In particular, when the void ratio is 3% or less, the void size is small as well, and the influence of the voids, which are air layers, is accordingly small. This makes it possible to reduce the loss of heat of the power element to a greater extent. On the other hand, if the void ratio is more than 3%, each void itself is large and the product may possibly reach an unintended temperature due to local heat generation. This increases the possibility that a certain number of products will break within a short period of time. Also, the above void ratio is particularly preferable in terms of joining strength.

[Evolution of Reliability of Sample Modules Obtained by Joining Components with Solder Materials]

The reliability of each sample module was evaluated by thermal cycle testing. Using plates of the solders of examples 1 to 18 and comparative examples 1 to 5 measuring 0.25 mm in thickness, a DCB substrate and a Cu heat dissipation plate were joined under joining conditions similar to those for the sample preparation for the wettability measurement described above. As for the conditions for the thermal cycle testing, holding the sample module at −45° C. for 10 minutes, heating it, and holding it at 155° C. for 10 minutes were counted as 1 cycle. As for the result of the thermal cycle testing, the solder joining was observed by SAT after each 100 cycles, and the number of cycles at which cracking occurred was recorded as the cycle at which the breakage was observed.

TABLE 1

| | Composition | Compositional Ratio of Elements (%) | | | | | High-Temperature Properties | | | Initial Property Voids (Wettability) Void (Defect) Ratio in Joining (%) | Reliability Test Thermal Cycle −45 to 155° C. per Cycle |
|---|---|---|---|---|---|---|---|---|---|---|---|
| | | | | | | | Elongation after Fracture (%) at High Temperature | | Tensile Strength (Mpa) | | |
| | | Sn | Sb | Ag | Ni | Ge/P | at 100° C. | at 175° C. | at 175° C. | | |
| Comparative Example 1 | Sn—Sb | Bal. | 5 | — | — | — | 49 | 51.5 | 12.0 | 25.0% | 100 |
| Comparative Example 2 | Sn—Sb—Ag | Bal | 8.5 | 2.5 | — | — | 50.54 | 52.76 | 21.6 | 20.0% | 100 |
| Comparative Example 3 | ↓ | Bal | 4.5 | 3.9 | — | — | 50 | 54 | — | 20.0% | 100 |
| Comparative Example 4 | ↓ | Bal | 8 | 2.5 | — | — | 50.7 | 52.9 | — | 20.0% | 100 |
| Comparative Example 5 | ↓ | Bal | 8 | 6.5 | — | — | 49.8 | 51.6 | — | 15.0~20.0% | 100 |
| Example 1 | Sn—Sb—Ag | Bal. | 8 | 3 | — | — | 53 | 60 | — | 15.0% | 300 |
| Example 2 | ↓ | Bal. | 8 | 5.0 | — | — | 53 | 60 | — | 10.0% | 300 |
| Example 3 | ↓ | Bal. | 6.2 | 3.6 | — | — | 54.76 | 61.91 | 21.2 | 10.0% | 300 |
| Example 4 | ↓ | Bal. | 5 | 5.0 | — | — | 52 | 60 | — | 15.0% | 300 |
| Example 5 | ↓ | Bal | 5 | 3 | — | — | 52 | 60 | — | 10.0% | 300 |
| Example 6 | ↓ | Bal. | 8 | 4.5 | — | — | 54.8 | 62 | — | 15.0% | 300 |
| Example 7 | Sn—Sb—Ag—Ni | Bal | 6.2 | 3.6 | 0.05 | — | 55 | 65 | 18.0 | 5~10% | 700 |
| Example 8 | ↓ | Bal. | 6.2 | 3.6 | 0.1 | — | 55 | 65.2 | — | 1~3% | 700 |
| Example 9 | ↓ | Bal | 6.2 | 3.6 | 0.15 | — | 55 | — | — | 1~3% | 700 |
| Example 10 | ↓ | Bal. | 6.2 | 3.6 | 0.25 | — | 55 | 65.5 | — | 1~3% | 700 |
| Example 11 | ↓ | Bal. | 6.2 | 3.6 | 0.3 | — | 55 | 65.4 | — | 5~10% | 700 |
| Example 12 | ↓ | Bal. | 6.2 | 3.6 | 0.5 | — | 55 | — | — | 10~15% | 250 |
| Example 13 | Sn—Sb—Ag—Ni—Ge | Bal. | 6.2 | 3.6 | 0.25 | Ge 0.003 | 55.08 | 66.17 | 17.6 | 1~3% | 1000 |
| Example 14 | ↓ | Bal. | 6.2 | 3.6 | 0.25 | Ge 0.008 | 55 | 67 | — | 1~3% | 1000 |
| Example 15 | ↓ | Bal. | 6.2 | 3.6 | 0.25 | Ge 0.02 | 55 | — | — | 5~10% | 250 |
| Example 16 | Sn—Sb—Ag—Ni—P | Bal. | 6.2 | 3.6 | 0.25 | P 0.003 | 55 | 64 | 18.5 | 1-3% | 1000 |
| Example 17 | ↓ | Bal. | 6.2 | 3.6 | 0.25 | P 0.008 | 55 | 62 | — | 1-3% | 1000 |
| Example 18 | ↓ | Bal. | 6.2 | 3.6 | 0.25 | P 0.02 | 55 | — | — | 1-3% | 300 |

The test results of the examples and the comparative examples are listed in Table 1. Note that in the table, "-" in the compositional ratio section indicates that the element was not an incidental impurity and was not substantially contained, and "-" in the measured value section represents that the value was not measured. It was found that the solder materials according to the examples of the present invention exhibited greater elongation after fracture at high temperatures of 100° C. and 175° C. than the solder materials according to the comparative examples and that the elongation after fracture at the high temperatures was highest with the solder materials according to the third embodiment, containing Sn—Sb—Ag with Ni and Ge added thereto with given composition ratios (%), followed by the solder materials according to the second embodiment, containing Sn—Sb—Ag with Ni added thereto with given composition ratios (%), and the solder materials according to the first embodiment, containing Sn—Sb—Ag with given composition ratios (%). Although the numerical data is not shown, it was found that the measured values of the elongation after fracture at 135° C. showed approximately the same tendency as the elongation after fracture at 100° C. and 175° C. Moreover, it was found that there was a significant correlation between the extent of the elongation after fracture at the high temperatures and the reliability, measured by the thermal cycle testing. In particular, it was found that the solder materials according to the second and third embodiments did not experience formation of any cracks at all when subjected to 400 cycles, and their thermal cycle lives until formation of a crack were improved to be at least two times longer.

Figure 2:
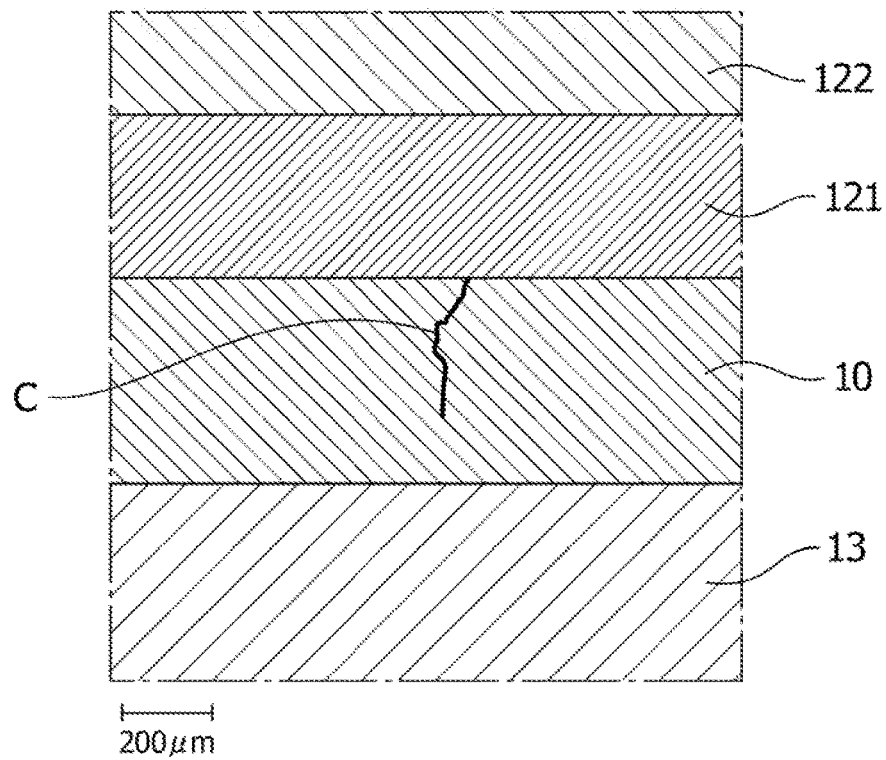
FIG. 2 is a conceptual diagram illustrating an example of a joined part using the solder material according to the present invention as a joining layer.

FIG. 2 illustrates the state of the sample module with the solder material of example 3 after fracture, observed after the thermal cycle testing. FIG. 2 is a conceptual diagram based on a scanning electron microscope image of a cross section of the semiconductor module. A solder joining layer 10, which is obtained by melting the solder material of example 3, is formed between, on the one hand, an insulating substrate 122 and Cu conductive plate 121, constituting a DCB substrate, and, on the other hand, a Cu heat dissipation plate 13. In the solder joining layer 10, a crack C is formed substantially perpendicularly to the solder joining layer 10, the Cu conductive plate 121, and the Cu heat dissipation plate 13, but the crack C has not penetrated through the solder joining layer 10. Also, no void is formed by the crack C, and the crack C can therefore be considered a minor crack in terms of the semiconductor module's electrical properties. In the solder material of example 3, illustrated in FIG. 2, alloy structures with a metal-structure grain size of about 200 to 500 μm formed at the initial phase of the joining are uniformly present (the specific structures are not illustrated in FIG. 2). For this reason, even if a crack is formed, the crack tends not to grow.

Figure 3:
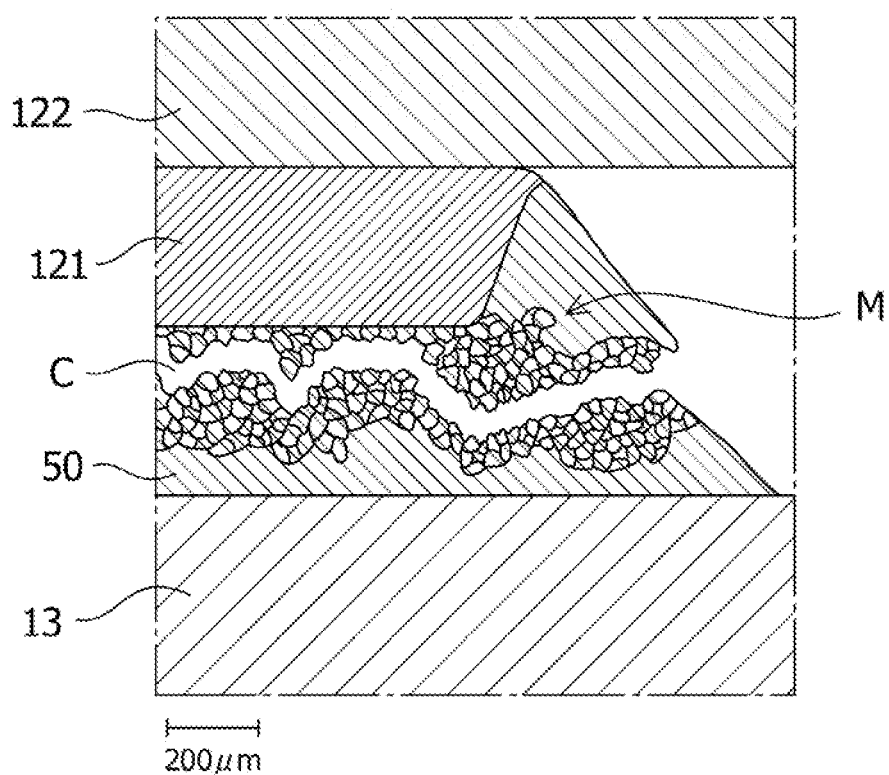
FIG. 3 is a conceptual diagram illustrating an example of a joined part using a solder material according to a comparative example as a joining layer.

FIG. 3 illustrates how fracture occurred in the sample module with the solder material of comparative example 2, observed after the thermal cycle testing. FIG. 3 is likewise a conceptual diagram based on a scanning electron microscope image of a cross section of the semiconductor module. A joining layer 50, which is obtained by melting the solder material of comparative example 2, is formed, on the one hand, between an insulating layer 122 and Cu electrode plate 121, constituting a DCB substrate, and, on the other hand, a Cu heat dissipation plate 13. In the joining layer 50, a large crack C is formed substantially in parallel to the solder joining layer 10, the Cu electrode plate 121, and the Cu heat dissipation plate 13. This crack C has formed a major void and, in terms of the semiconductor module's electrical properties, is a serious defect that can cause an increase in resistance. Also, it can be observed that the solder material has recrystallized as a result of its thermal history and main crystal grains M have locally broken down into extremely fine grains having grain sizes of roughly about 10 to 50 μm. The fine crystal grains M are found mostly around the crack. This can be considered to have occurred due to: application of thermal stress in a shear direction, which caused formation of a crack; and growth of the crack along the interfaces of crystal grains M that have broken down into fine grains along the shear direction. In contrast, with the compositions of the examples, it can be assumed that Ni compounds and/or Ag compounds made it difficult for crystal grains to locally break down into fine grains at the time of SnSb recrystallization.

The results of the examples of the present invention and the comparative examples show that a composition within any of the predetermined composition ranges of the examples allows a solder material to have high ductility at high temperature and thus have an improved thermal cycle life. Also, it is found that a composition within any of the predetermined composition ranges of the examples suppresses the occurrence of a phenomenon in which crystal grains locally break down into extremely fine grains when the crystal grains are recrystallized by a thermal cycle. In other words, by using components that form an optimum solidified structure via solidified structure uniformization, solidification strengthening, and dispersion strengthening, it is possible to suppress deterioration (cracking) of the solder due to thermal deformation and therefore improve the thermal-cycle fatigue property.

The preceding examples can be repeated with similar success by substituting the generically or specifically described reactants and/or operating conditions of this invention for those used in the preceding examples.

It has been noted that the Sn—Sb—Ag eutectic phase portions that can be contained in the compositions of examples 1 to 6 (Sn-6.2Sb-3.6Ag; note that there is a certain width of the eutectic composition ranges) are relatively soft and also ductile at high temperature, that is, high in percentage elongation after fracture. In a predetermined composition range from the eutectic point, the solder material has the stable and segregation-resistant characteristics found at the eutectic point. Outside the predetermined range, however, the ductility at high temperature is low such that cracking is likely to occur and the module reliability is low.

Although not wishing to be bound by any theoretical explanation of the invention, it is believed that this occurs due to the aforementioned segregation and crystallization of an intermetallic compound. That is, it appears that the material becomes hard and, when receiving a certain degree of stress (strain), the solder fails to uniformly distribute the received force but lets the strain concentrate at the spots in which the balance of force has been lost. In this way is appears that the material is compressed, experiences hardening, and breakage occurs at the interface between a hard spot and a soft spot. There is a difference in the amount of cracks formed between the composition Sn-5Sb of a comparative example and the composition Sn-6.2Sb-3.6Ag of example 3, and crystallization of a compound that inhibits growth of cracks can be considered to have contributed to the longer thermal cycle life.

The compositions of Examples 7 to 12, containing Sn—Sb—Ag with Ni present therein within predetermined ranges, have further improved ductility at high temperature. Again, not wishing to be bound by any particular theoretical explanation, it is believed that this occurs because Ni retards recovery by dislocation within crystals and an NiSn compound is dispersed within the solder. This appears to relax local stress concentration and allows deformation of the entire body in response to forced input of external force, so that the ductility is improved. On the other hand, the strength itself is slightly lower. In tensile fracture testing, local hardening occurs at spots in which force concentration occurs, and the spots experiencing the hardening have high hardness, like compressed rubber. An Ni-added product has a structure that distributes force, as mentioned earlier. Since segregation is less likely to occur and spots in which force concentration occurs are distributed, the entire structure of the testing portion is deformed. Thus, an increase in strength by hardening does not occur. Accordingly, the fracture strength is slightly lower. Nonetheless, for module reliability, what is important is to retard deterioration via force distribution before fracture occurs, and the strength at fracture and the reliability are not directly linked to each other. Hence, the materials in which Ni is added, which improves ductility at high temperature, can be considered balanced.

The compositions of examples 13 to 15, containing Sn—Sb—Ag—Ni with Ge further added, have slightly improved ductility. This is believed to have occurred because Ge is dispersed in grain boundaries between Sn—Sb etc., thereby lowering the grain boundary strength of the grain boundaries and allowing grain boundary sliding. In this way, a concentration of force applied to the solder-joined body due to temperature is relaxed and the ductility of the alloy structure in a state of receiving strain is improved. For these compositions, it was confirmed by Auger electron spectroscopy (AES) mapping that Ge segregated in the vicinity of Sn grain boundaries. Specifically, segregation of Ge was confirmed at the boundary of two adjacent Sn grains as a result of performing mapping with a scanning Auger electron spectromicroscope SAM670, manufactured by PHI, Inc., under testing conditions of an accelerating voltage of 20 kv, a sample current of 16 nA, a beam diameter of less than 50 nm, and a sample tilt angle of 0 degrees. Based on this fact, it is possible that Ge can promote grain boundary sliding in response to thermal strain and suppress recrystallization of Sn.

Note that if the amount of Ge added is excessively large, e.g. if more than 0.01% Ge is present, a strong GeO film will be formed and lower the wettability of the solder. Consequently, many defects containing air will be formed and may possibly lower the module reliability.

The compositions of Examples 16 to 18, containing Sn—Sb—Ag—Ni with P further added, have slightly improved tensile strength. This is believed to have occurred because, with the addition of P, a high-hardness Sn—P compound is distributed in the joining layer and inhibits cracking and spread of dislocation (shifting of a lattice defect in a crystal inside a solidified structure) when stress is applied to the joining layer.

The solder material according to the present invention can be used as a joining for semiconductor chips and the like in electronic devices in general designed for high current. In particular, the solder material according to the present invention can be preferably used for packaged components such as ICs. Moreover, the solder material according to the present invention can be preferably used as a die-bonding joining for components that generate a large amount of heat, e.g. LED elements and power semiconductor elements such as power diodes, and also as a die-bonding joining for internally connecting IC elements and the like in electronic components in general mounted on a printed wiring board or the like.

The invention claimed is:

1. A semiconductor device comprising:
a joining layer between a semiconductor element and a substrate electrode or lead frame or between the substrate electrode and a heat dissipation plate, the joining layer being obtained by melting a solder material selected from:
(a) a solder material consisting of:
not less than 6.0% by mass and not more than 8.0% by mass Sb;
not less than 3.0% by mass and not more than 5.0% by mass Ag;
not less than 0.05% by mass and not more than 0.3% by mass Ni;
Sn; and
incidental impurities,
wherein
when the incidental impurities include Cu, the Cu is present as no more than one of the incidental impurities such that the solder material is essentially free of Cu; or
(b) a solder material consisting of:
more than 6.0% by mass and not more than 8.0% by mass Sb;
not less than 3.0% by mass and not more than 5.0% by mass Ag;
not less than 0.05% by mass and not more than 0.3% by mass Ni;
not less than 0.003% by mass and not more than 0.01% by mass Ge and/or P Sn; and
incidental impurities,
wherein
when the incidental impurities include Cu, the Cu is present as no more than one of the incidental impurities such that the solder material is essentially free of Cu.

2. The semiconductor device according to claim 1, wherein the substrate electrode, lead frame, or heat dissipation plate is made of, or plated with, Ni, Cu, or an alloy of Ni or Cu.

3. The semiconductor device according to claim 1, wherein the semiconductor element is an Si or SiC semiconductor element.

4. The semiconductor device according to claim 1, wherein the semiconductor element is an Si or SiC semiconductor element.

* * * * *